United States Patent
Blum

(10) Patent No.: US 7,289,003 B2
(45) Date of Patent: Oct. 30, 2007

(54) METHOD AND APPARATUS FOR AMPLITUDE CONTROL USING DYNAMIC BIASING IN A VOLTAGE CONTROLLED OSCILLATOR

(75) Inventor: Gregory A. Blum, Lagrangeville, NY (US)

(73) Assignee: Seiko Epson Corporation, Tokyo (JP)

( * ) Notice: Subject to any disclaimer, the term of this patent is extended or adjusted under 35 U.S.C. 154(b) by 112 days.

(21) Appl. No.: 11/196,644

(22) Filed: Aug. 3, 2005

(65) Prior Publication Data
US 2007/0046387 A1    Mar. 1, 2007

(51) Int. Cl.
  H03L 5/00    (2006.01)
  H03B 5/18    (2006.01)
  H03B 5/08    (2006.01)
(52) U.S. Cl. .................. 331/183; 331/117 FE; 331/117 R; 331/167; 331/182
(58) Field of Classification Search .......... 331/117 FE, 331/117 R, 109, 167, 177 R, 182, 183
See application file for complete search history.

(56) References Cited

U.S. PATENT DOCUMENTS

| 6,064,277 | A | * | 5/2000 | Gilbert ................ 331/117 R |
| 6,268,777 | B1 | | 7/2001 | Welch |
| 6,483,391 | B1 | | 11/2002 | Magoon et al. |
| 6,664,865 | B2 | * | 12/2003 | Groe et al. ............... 331/183 |
| 6,680,657 | B2 | * | 1/2004 | Wang et al. ............. 331/177 V |
| 6,700,450 | B2 | | 3/2004 | Rogers |
| 6,781,471 | B2 | | 8/2004 | Huang |
| 6,909,336 | B1 | * | 6/2005 | Rajagopalan et al. ....... 331/183 |
| 7,126,435 | B2 | * | 10/2006 | Naviasky et al. ........... 331/182 |
| 2003/0025566 | A1 | * | 2/2003 | Rogers ................... 331/109 |
| 2004/0104782 | A1 | * | 6/2004 | Ruffieux ................ 331/117 R |

* cited by examiner

Primary Examiner—Benny Lee
Assistant Examiner—Ryan J Johnson

(57) ABSTRACT

A method, circuit, and/or system for controlling an amplitude and/or limiting or reducing the energy consumed by an LC voltage controlled oscillator (LCVCO). In one embodiment, an oscillator can include: (i) a bias circuit that can provide first and second bias signals; (ii) an oscillator core that can provide a periodic signal with a frequency related to the first bias signal and an amplitude, where the oscillator core can also provide a feedback signal; and (iii) a current/amplitude controller that can control the amplitude by dynamically dusting the first bias signal in response to the feedback signal. Embodiments of the present invention can advantageously provide a reliable and simplified design approach for amplitude control and substantial energy reduction in an oscillator, such as an LCVCO circuit or a Colpitts differential oscillator.

19 Claims, 4 Drawing Sheets

METHOD AND APPARATUS FOR AMPLITUDE CONTROL USING DYNAMIC BIASING IN A VOLTAGE CONTROLLED OSCILLATOR

FIELD OF THE INVENTION

The present invention generally relates to the field of periodic signal generation and control. More specifically, embodiments of the present invention pertain to methods and circuits for controlling an amplitude of a periodic signal using dynamic biasing in a voltage controlled oscillator (VCO).

DISCUSSION OF THE BACKGROUND

In many digital communication systems, a reference clock may be used to sample data signals at fixed intervals. A low frequency reference clock can be generated using a crystal oscillator. However, because such crystals are typically not available for high frequency applications, a phase-locked loop (PLL) may be used to produce a high frequency periodic signal. Such a PLL may receive a low frequency reference signal and then gain or multiply the frequency to a desired value or oscillation output. In a typical PLL design, a voltage-controlled oscillator (VCO) may be used to produce a high frequency periodic signal. Further, an LC tank circuit may be used as a frequency controlling element in the VCO (LCVCO), using variable capacitors (e.g., varactors) that change capacitance values based on a control voltage applied thereto.

However, an integrated LCVCO's center frequency may vary significantly (e.g., 10-15%) with process variations. Accordingly, a large "pulling range," or the maximum change in output frequency that can be attained via an applied control voltage, may be required to compensate for the center frequency variation. Further, the changing capacitance of the LC tank may cause associated variations in the loading conditions of the circuit. As a result, different amounts of energy may be needed to guarantee oscillation for different bias conditions.

In many conventional LCVCO designs, in order to guarantee oscillation, an amount of energy sufficient to ensure oscillation under all process conditions is generally supplied to the circuit. In this approach, it is very difficult to determine a precise amount of energy necessary for oscillation. Accordingly, a designer will typically supply more energy than a minimum necessary amount in order to guarantee oscillation for all appropriate process conditions. Undesirably, power may thus be wasted because the VCO may take more power than necessary for oscillation at certain process conditions. Also due to the excess energy supplied, the amplitude of oscillation can be relatively large at process corners where excess energy is not needed. Such a large amplitude can give rise to other design considerations, such as ensuring that devices in the circuit do not become overly stressed due to excessive voltage conditions provided by the LC tank circuit. On the other hand, if not enough energy is supplied, under some process, voltage and temperature (PVT) conditions, the LCVCO may have a very small amplitude of oscillation, or the circuit may not even oscillate at all. No oscillation is clearly an undesirable condition. Also undesirable is a relatively small amplitude of oscillation because noise in the circuit can have a relatively large effect on associated oscillator jitter performance.

What is needed is an amplitude regulation approach suitable for an LCVCO circuit. Further, what is needed is an approach that reduces or minimizes the amount of energy that such an LCVCO circuit uses in typical operations. The meeting of such needs may provide further benefits, such as overcoming operational variations due to process, temperature, and parasitics (e.g., those added to the circuit during the integration process) in an LCVCO or other oscillator circuit design.

SUMMARY OF THE INVENTION

Embodiments of the present invention relate to methods, algorithms, software, architectures, circuits, and/or systems for controlling an amplitude and/or limiting the energy (e.g., current and/or voltage) supplied to an LC voltage controlled oscillator (LCVCO).

In one embodiment, an oscillator can include: (i) a bias circuit that can provide first and second bias signals; (ii) an oscillator core that can provide a periodic signal with a frequency related to the first bias signal and an amplitude, where the oscillator core can also provide a feedback signal; and (iii) a current/amplitude controller that can control the amplitude by dynamically adjusting the first bias signal in response to the feedback signal. The bias circuit can be resistively coupled to the oscillator core through a transistor in the current/amplitude controller, for example. Further, the oscillator core can include a resonator or an LC tank for determining the frequency of oscillation. Also, the periodic signal can be a differential periodic signal.

In another embodiment, a method of controlling an amplitude of a periodic signal can include the steps of: (i) determining or detecting information related to the amplitude; (ii) adjusting a bias signal in response to the information; and (iii) reducing the amplitude in response to an adjustment to the bias signal when the information indicates that the amplitude is greater than a predetermined value. The method may further include generating the periodic signal, for example.

In another embodiment, an oscillator control circuit can include: (i) a current mirror controlled by a bias signal; (ii) a capacitor coupled to the current mirror, where the capacitor can stabilize mirrored current from the current mirror and provide the stabilized, mirrored current to an oscillator; (iii) an amplitude detection circuit that can provide amplitude information from a periodic signal output by the oscillator; and (iv) a feedback circuit that can adjust the bias signal in response to the amplitude information.

In another embodiment, a resonator tank circuit can include: at least one variable capacitor configured to receive a control voltage and at least one fixed capacitor coupled to the variable capacitor. At least one of the variable capacitor(s) and the fixed capacitor(s) is coupled to a node carrying or providing a periodic signal. The resonator tank circuit can further include: a resonator coupled to at least one of the variable capacitor(s) and the fixed capacitor(s), and an imbalance circuit coupled to at least one of the fixed capacitor(s) and the resonator, and configured to provide an imbalance across the resonator.

Embodiments of the present invention can advantageously provide a reliable and simplified design approach for amplitude control and substantial energy reduction or minimization in an oscillator, such as an LCVCO circuit or a Colpitts differential oscillator. Further, embodiments of the present invention are adaptable to any LCVCO or like circuit where a current is used to control the transconductance of one or more gain transistors. These and other advantages of the present invention will become readily apparent from the detailed description of preferred embodiments below.

DETAILED DESCRIPTION OF THE PREFERRED EMBODIMENTS

Figure 1:
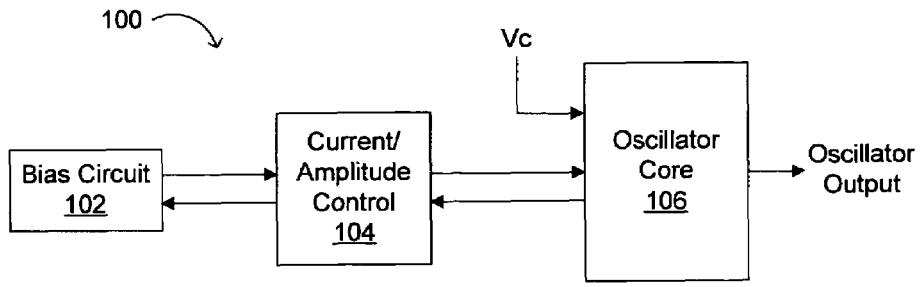
FIG. 1 is a block diagram showing an oscillator using a current/amplitude control circuit in accordance with embodiments of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on code, data bits, data streams or waveforms within a computer, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like, and to their representations in computer programs or software as code (which may be object code, source code or binary code).

It should be borne in mind, however, that all of these and similar terms are associated with the appropriate physical quantities and/or signals, and are merely convenient labels applied to these quantities and/or signals. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a circuit, computer or data processing system, or other device (e.g., an electrical, optical, or quantum computing or processing device or circuit), that manipulates and transforms data represented as physical (e.g., electronic) quantities. The terms may refer to actions and processes of the processing devices that manipulate or transform physical quantities within the component(s) of a circuit, system or architecture (e.g., registers, memories, other such information storage, transmission or display devices, etc.) into other data similarly represented as physical quantities within other components of the same or a different system or architecture.

Furthermore, in the context of this application, the terms "wire," "wiring," "line," "signal," "conductor" and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Similarly, for convenience and simplicity, the terms "clock," "time," "timing," "rate," "period" and "frequency" are, in general, interchangeable and may be used interchangeably herein, but are generally given their art-recognized meanings. Also, for convenience and simplicity, the terms "data," "data stream," "waveform" and "information" may be used interchangeably, as may (a) the terms "flip-flop," "latch" and "register," and (b) the terms "connected to," "coupled with," "coupled to," and "in communication with," (which may refer to direct or indirect connections, couplings, or communications) but these terms are generally given their art-recognized meanings herein.

Embodiments of the present invention relate to methods, algorithms, software, architectures, circuits, and/or systems for controlling an amplitude and reducing or limiting the energy consumed by an LC voltage controlled oscillator (LCVCO). For example, the method and/or algorithm for controlling an amplitude of a periodic signal can include the steps of: (i) determining or detecting information related to the amplitude; (ii) adjusting a bias signal in response to the information; and (iii) reducing the amplitude in response to an adjustment to the bias signal when the information indicates that the amplitude is greater than a predetermined value. The method may further include generating the periodic signal, for example.

In another aspect of the invention, an oscillator can include: (i) a bias circuit that can provide first and second bias signals; (ii) an oscillator core that can provide a periodic signal with a frequency related to the first bias signal and an amplitude, where the oscillator core can also provide a feedback signal; and (iii) a current/amplitude controller that can control the amplitude by dynamically dusting the first bias signal in response to the feedback signal. The bias circuit can be resistively coupled to the oscillator core through a transistor in the current/amplitude controller, for example. Further, the oscillator core can include a resonator or an LC tank for determining the frequency of oscillation.

In another aspect of the invention, an oscillator control circuit can include: (i) a current mirror controlled by a bias signal; (ii) a capacitor coupled to the current mirror, where the capacitor can stabilize mirrored current from the current mirror and provide the stabilized, mirrored current to an oscillator; (iii) an amplitude detection circuit that can provide amplitude information from a periodic signal output by the oscillator; and (iv) a feedback circuit that can adjust the bias signal in response to the amplitude information.

The invention further relates to hardware and/or software implementations of the present architecture, method and system. Embodiments of the present invention can advantageously provide a reliable and simplified design approach for amplitude control and substantial energy reduction or minimization in an oscillator, such as an LCVCO circuit or a Colpitts differential oscillator. Further, embodiments of the present invention are adaptable to any LCVCO or like circuit where a current is used to control the transconductance of one or more gain transistors. These and other advantages of the present invention will become readily apparent from the detailed description of preferred embodiments below. The invention, in its various aspects, will be explained in greater detail below with regard to exemplary embodiments.

An Exemplary Oscillator Arrangement

An exemplary oscillator can include: (i) a bias circuit that can provide first and second bias signals; (ii) an oscillator core that can provide a periodic signal with a frequency related to the first bias signal and an amplitude, where the oscillator core can also provide a feedback signal; and (iii) a current/amplitude controller that can control the amplitude by dynamically dusting the first bias signal in response to the feedback signal. The bias circuit can be resistively coupled to the oscillator core through a transistor in the current/amplitude controller, for example. Further, the oscillator core can include a resonator or an LC tank for determining the frequency of oscillation.

Referring now to FIG. 1, a block diagram showing an oscillator using a current/amplitude control circuit in accordance with embodiments of the present invention is indicated by the general reference character 100. Bias circuit 102 can interface (e.g., via signals 120 and 122) with current/amplitude control 104. Bias circuit 102 is generally analog in nature and can be any standard circuit for generating voltage and/or current bias signals. Bias circuit 102 and current/amplitude control 104 can interface with oscillator core 106 (e.g., via signals 124 and 126) to effectively receive amplitude information from oscillator core 106 and pass this information to bias circuit 102 for dynamic adjustment.

In an example operation, current/amplitude control 104 may receive amplitude information from oscillator core 106 on signal 126. Current/amplitude control 104 may then provide amplitude information via signal 122 to bias circuit 102. Bias circuit 102 may communicate an adjusted bias signal 120 to current/amplitude control 104. A periodic signal amplitude (e.g., of oscillator output) in oscillator core 106 may then be adjusted using signal 124 from current/amplitude control 104. Signals 120, 122, 124 and 126 may thus be analog or digital, and if digital, (i) single-ended or differential and/or (ii) single-bit or multi-bit.

A resonator or an LC tank may also be included within or associated with oscillator core 106. In some applications, a crystal may be used in place of LC elements for oscillation.

In either case, control voltage (e.g., Vc) can be applied to oscillator core 106 to change the capacitances of variable capacitors (e.g., one or more varactors, or a programmable bank or array of capacitors) in the resonator tank. The variable nature of the capacitance allows for a variable frequency produced by the resonator tank in response to the control voltage, Vc. The oscillator output may then be generated at a desired frequency.

Figure 2:
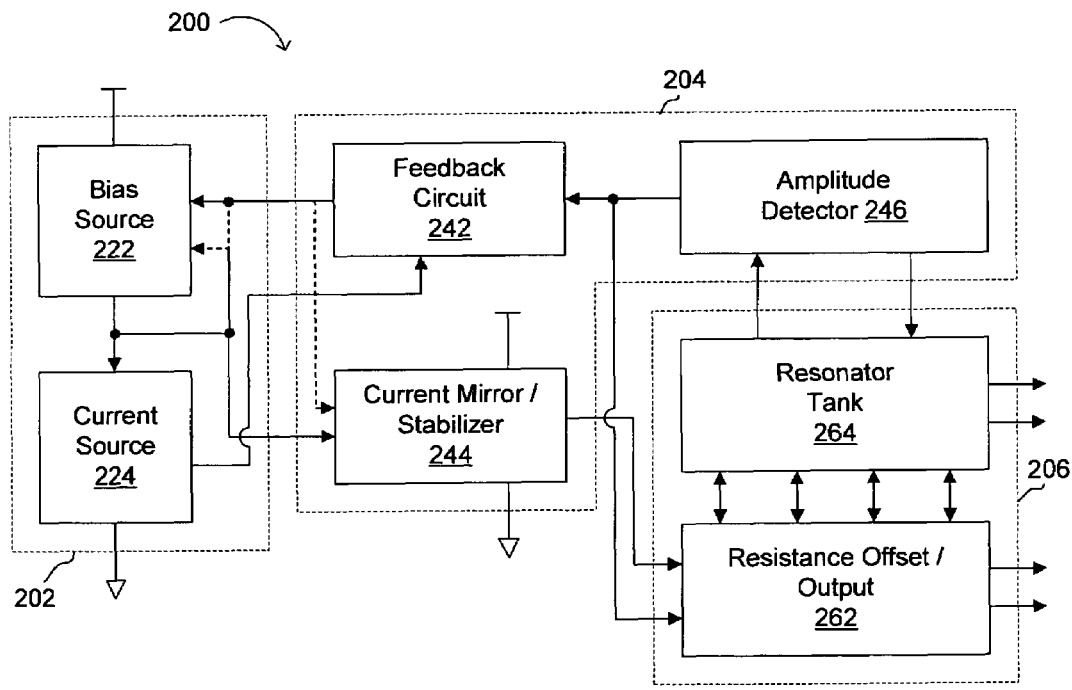
FIG. 2 is a block diagram showing functional blocks within bias circuit, current/amplitude control, and oscillator core blocks in accordance with embodiments of the present invention.

Referring now to FIG. 2, a block diagram showing functional blocks within bias circuit, current/amplitude control, and oscillator core blocks in accordance with embodiments of the present invention is indicated by the general reference character 200. Bias circuit 202 can include bias source 222 and current source 224. Bias circuit 202 generally provides a dynamically adjustable bias signal. Current/amplitude control 204 can include feedback circuit 242, amplitude detector 246, and current mirror/stabilizer 244. Current/amplitude control 204 generally determines when an amplitude adjustment is to be made and provides appropriate control information to bias circuit 202. Oscillator core 206 can include resonator tank 264 and resistance offset/output circuit 262. Oscillator core 206 generally provides an oscillating (or periodic) signal that can be controlled by the dynamically adjustable bias signal from bias circuit 202.

In bias circuit 202, bias source 222 can receive a first predetermined voltage (e.g., Vdd) and a feedback signal (e.g., via path 274A and/or 274B). Current source 224 may receive signal 270 from bias source 222 and a second predetermined voltage (e.g., Vss or other ground potential). As shown, current source 224 may provide a bias signal 272 to feedback circuit 242. Feedback circuit 242 may also supply a feedback signal path 274C to current mirror/stabilizer 244. Feedback signal path implementations 274A, 274B, and/or 274C may vary according to different embodiments based on the particular implementations (e.g., number of transistors, diodes, resistors and/or other devices used therein) of bias source 222, current source 224, feedback circuit 242, and current mirror/stabilizer 244. For example, if bias source 222 comprises two diodes, or a resistor and a diode, in series, one such device may receive signal 274A at a terminal thereof and the other device may receive signal 274B at a terminal thereof. Thus, depending on design considerations, current mirror/stabilizer 244 may receive either signal 274A/274C or signal 274B.

In current/amplitude control block 204, amplitude detector 246 can interface with oscillator core 206 (e.g., via signals 284 to resonator tank 264 and via signal 276 to resistance offset/output 262). Amplitude detector 246 may also provide amplitude information on signal 276 to feedback circuit 242. Amplitude detector 246 may include a device or circuit configured to increase a DC bias of the feedback signal (e.g., 274A, 274B, 274C), to increase a DC bias of oscillating signals in oscillator core 206, and/or to clamp a lower end of an amplitude range of the periodic signal generated in oscillator core 206, for example. Current mirror/stabilizer 244 may receive the feedback signal (e.g., via signal path 274C) from feedback circuit 242 and current mirror/stabilizer 244 may interface (e.g., via signal 278) to resistance offset/output 262 in oscillator core 206. Current mirror/stabilizer 244 can generally control transistor transconductance that is substantially correlated to periodic signal amplitude, as will be discussed in more detail below with reference to FIG. 4.

In oscillator core 206, resonator tank 264 may also interface with resistance offset/output 262. Resonator tank 264 may be a crystal or an LC tank to facilitate oscillation, for example. Resonator tank 264 may also interface with amplitude detector 246 (e.g., via signals 284) in current/amplitude control 204. Periodic signal amplitude information (e.g., when the amplitude is higher than a predetermined value) may be determined in amplitude detector 246 based on a testing or detecting of signals 284. Differential outputs from oscillator core 206 can generally be taken from signals 280 output from resonator tank 264 and/or signals 282 output from resistance offset/output 262. Alternatively, a single-ended oscillating output can be taken from any one of signals 280 and 282.

An Exemplary Method of Controlling an Amplitude of a Periodic Signal

An exemplary method and/or algorithm for controlling an amplitude of a periodic signal can include the steps of: (i) determining or detecting information related to the amplitude; (ii) adjusting a bias signal in response to the information; and (iii) reducing the amplitude in response to an adjustment to the bias signal when the information indicates that the amplitude is greater than a predetermined value. The method may further include generating the periodic signal, for example. In addition, the method may include increasing an amplitude when the information indicates the amplitude is less than a second predetermined value (e.g., during a circuit power-up phase).

Figure 3:
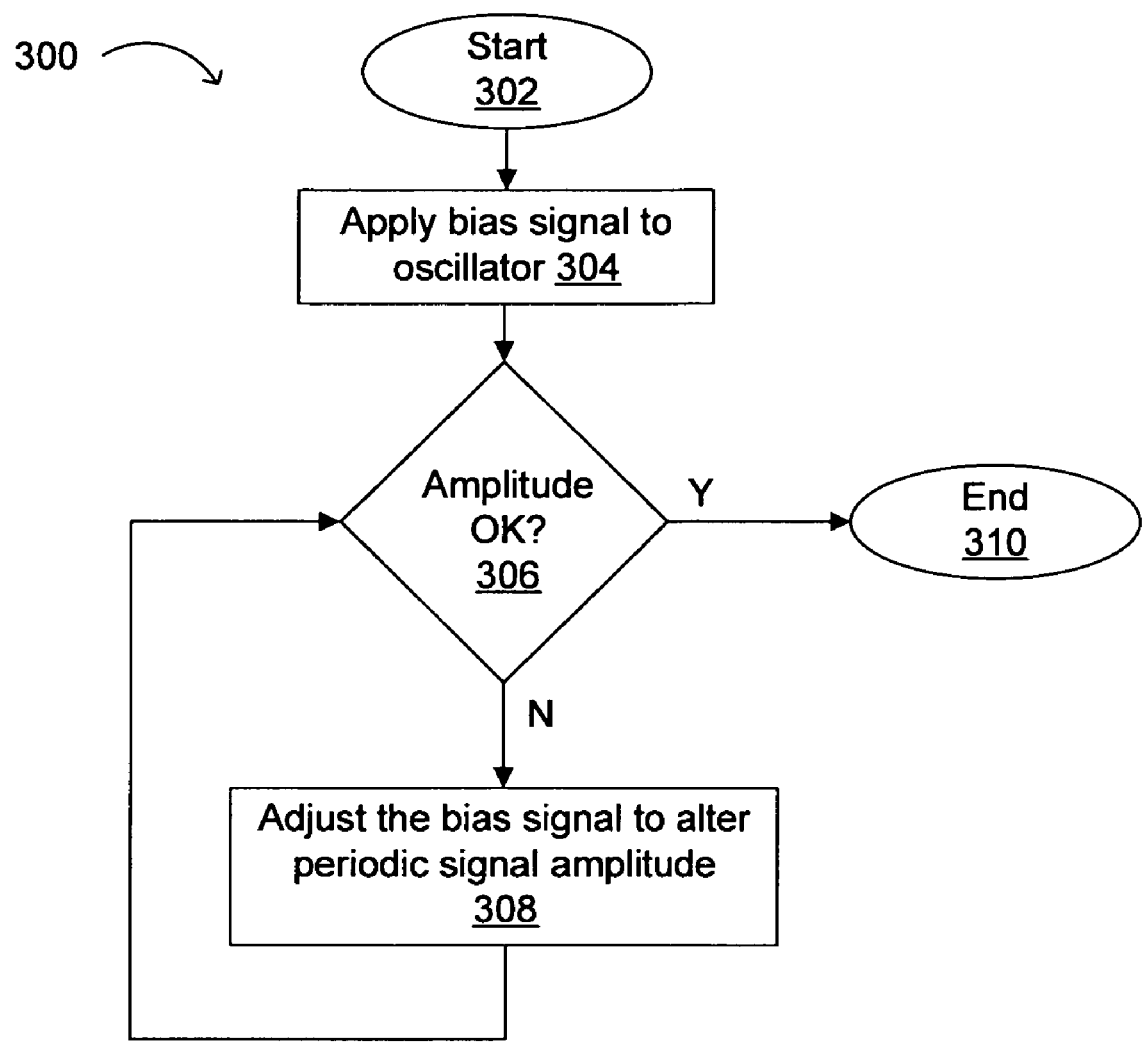
FIG. 3 is a flow diagram showing a method of amplitude control for an oscillator in accordance with embodiments of the present invention.

Referring now to FIG. 3, a flow diagram showing a method of amplitude control for an oscillator in accordance with embodiments of the present invention is indicated by the general reference character 300. The flow can begin (302) and a bias signal can be generated (304). An oscillator amplitude may essentially be tested (306) to determine if any adjustments in the regulation mechanism should be made. Such testing can be done by determining or detecting information related to the amplitude. If the amplitude is acceptable for the particular circuit application, the flow can complete (310). However, if the amplitude is not acceptable for the oscillator application, the bias signal may be adjusted to alter the oscillating signal amplitude (308) and the flow can return to re-test the amplitude (306). For example, if the amplitude test (306) determined that the oscillating signal amplitude was too low, the bias signals can be dynamically adjusted (308) to increase the amplitude accordingly. Alternatively, if the amplitude test (306) determined that the oscillating signal amplitude was too high, the bias signals can be dynamically adjusted (308) to decrease the amplitude accordingly.

Upon oscillator circuit power-up, the amplitude of a periodic signal may continue to increase until an equilibrium state or limit is reached. However, if an overshoot situation occurs where the amplitude is too high for a particular application, the bias signal may be adjusted. In response to the adjusted bias signal, the amplitude of oscillation may be reduced by reducing a transconductance of one or more oscillator transistors. In this fashion, an oscillator in accordance with embodiments may dynamically adjust the amplitude of a periodic signal.

In accordance with various embodiments of the invention, the method may further comprise averaging (or reducing spikes in) a current flowing through one or more current mirrors (or transistors therein), so as to improve the stability of a feedback loop. Generally, such current averaging can be implemented by one or more capacitive components (e.g., capacitor C1 in FIG. 4, discussed below). When the feedback loop reaches equilibrium, the current flowing through these current mirrors (or the transistors in such current mirrors) may be essentially optimized to provide an amplitude of oscillation such that an amplitude detection circuit (e.g., transistor M6 in FIG. 4, discussed below) may substantially determine the amplitude. Thus, the present method may further comprise determining the amplitude of the periodic signal with an amplitude detector.

Further, the amplitude detector can effectively increase a DC average voltage with respect to ground on oscillating nodes (e.g., a feedback and/or amplitude information signal such as signals 274A/C and/or 276 in FIG. 2, discussed above). In one embodiment, the method further comprises regulating (e.g., reducing or limiting a gain in) a feedback path. Such regulation can be implemented using one or more resistive components (e.g., resistor R1 in FIG. 4 discussed below) in connection with one or more current mirrors (or transistors therein) to establish a current gain. The resistive component may also affect (e.g., change) the current gain as a function of voltage (e.g., a feedback signal voltage), generally making the gain function more linear and improve overall loop stability.

An Exemplary Oscillator Control Circuit

An exemplary oscillator control circuit can include: (i) a current mirror controlled by a bias signal; (ii) a capacitor coupled to the current mirror, where the capacitor can stabilize mirrored current from the current mirror and provide the stabilized, mirrored current to an oscillator; (iii) an amplitude detection circuit that can provide amplitude information from a periodic signal output by the oscillator; and (iv) a feedback circuit that can adjust the bias signal in response to the amplitude information.

Figure 4:
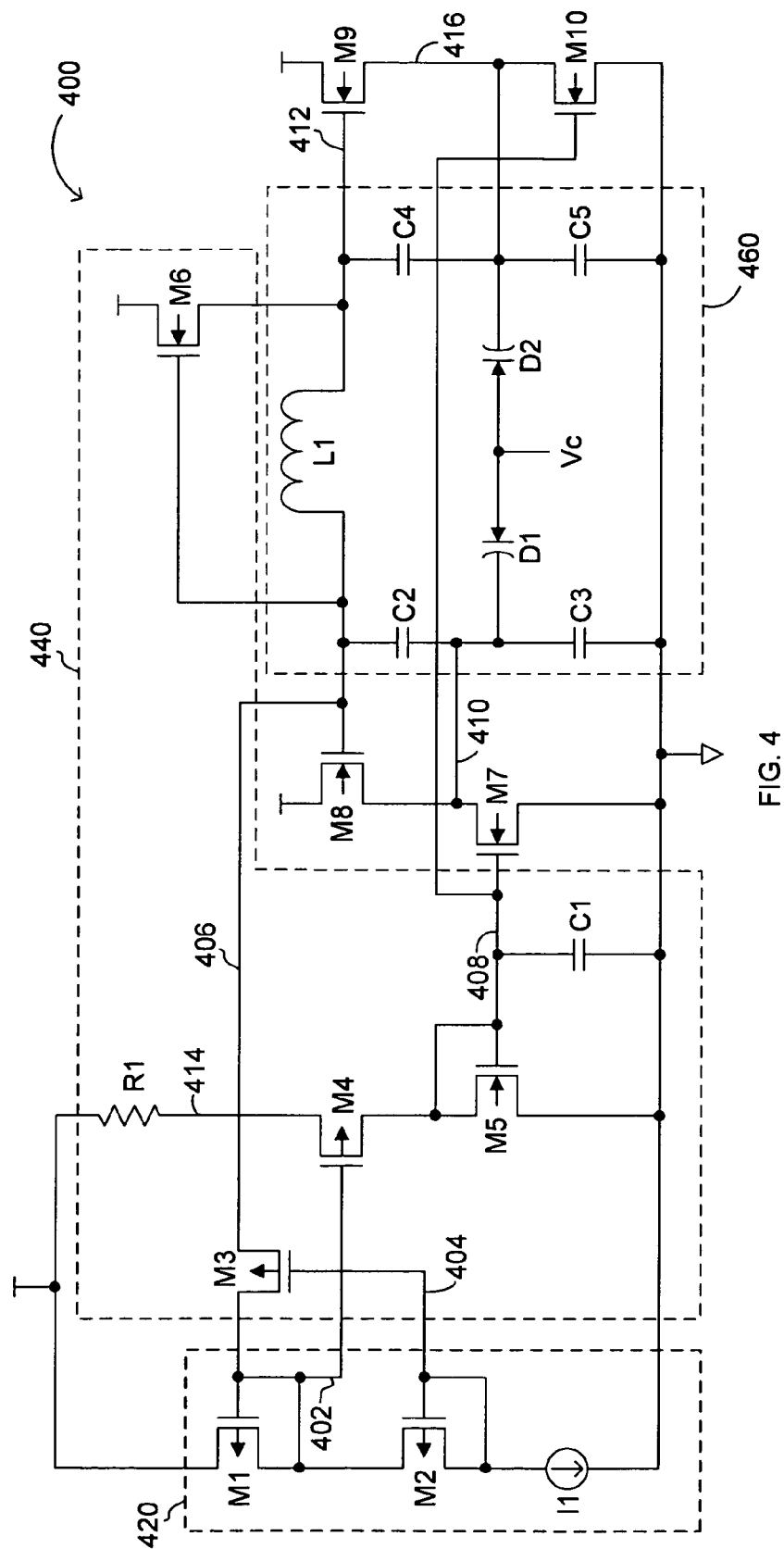
FIG. 4 is a schematic diagram showing a bias network integrated with a differential LC voltage controlled oscillator (LCVCO) in accordance with embodiments of the present invention.

Referring now to FIG. 4, a schematic diagram showing a bias network integrated with a differential LC voltage controlled oscillator (LCVCO) in accordance with embodiments of the present invention is indicated by the general reference character 400. This exemplary circuit is generally divided into portions: (i) bias circuit 420; (ii) current/amplitude control 440; and (iii) resonator tank 460. Further, a resistance offset/output portion can include NMOS transistors M7, M8, M9, and M10, for example. Bias circuit 420 can generally include, for example, PMOS transistor M1, PMOS transistor M2, and current source I1. Current/amplitude control 440 can generally include, for example, PMOS transistor M3, resistor R1, PMOS transistor M4, NMOS transistor M5, NMOS transistor M6, and fixed capacitor C1. Resonator tank 460 can include, for example, voltage-controlled variable capacitors (e.g., varactors) D1 and D2, as well as fixed capacitors C2, C3, C4, and C5, and inductor L1. In an alternate embodiment to form a Colpitts type oscillator, transistor M8, capacitors C2 and C3, and inductor L1 may be replaced with an oscillating crystal.

The exemplary arrangement of bias circuit 420 can be as follows. The source of transistor M1 can connect to a supply voltage, such as Vdd. The gate and drain of transistor M1 can connect to the drain of transistor M2, and transistors M3 and M4 of current/amplitude portion 440 via node 402. The gate and drain of transistor M2 can connect to one terminal of current source I1 and the gate of transistor M3 via node 304. Current source I1, which may be any standard or conventional type of DC current source, may have another terminal connected to a ground supply rail, such as Vss.

The exemplary arrangement of current/amplitude control 440 can be as follows. Resistor R1 can connect to Vdd and the source of transistor M4 via node 414. The gate of transistor M4 can interface to bias circuit 420 and transistor M3 via node 402. The drain of transistor M4 can connect to the source and gate of transistor M5 via node 408. The source of transistor M5 can connect to Vss. The drain of transistor M6 can connect to Vdd, while the gate of M6 can connect to node 406 and the source of transistor M6 can connect to node 412.

The exemplary arrangement of resonator tank 460 (e.g., in an oscillator core circuit) can be as follows. Resonator tank 460 (e.g., an LC tank) can receive capacitor control voltage Vc at one terminal of variable capacitor or varactor D1 and the other terminal of D1 can connect to capacitors C2 and C3, as well as transistors M7 and M8, at node 410. Variable capacitor or varactor D2 can also receive Vc at one terminal and the other terminal of D2 can connect to capacitors C4 and C5, as well as transistors M9 and M10, at node 416. Inductor L1 can connect at one terminal (e.g., node 406) to capacitor C2 and transistors M3, M6, and M8. Inductor L1 can connect at a second terminal (e.g., node 412) to capacitor C4 and transistors M6 and M9. Capacitors C3 and C5 can also connect to Vss.

In one embodiment, a differential oscillator core portion can include resonator tank 460 as well as a resistance offset/output portion (e.g., transistors M7, M8, M9, and M10). The drain of transistor M7 can connect to the source of transistor M8 and capacitors C2 and C3, and varactor D1 at node 410. The gate of transistor M7 can connect to the gate of transistor M10 and also to transistors M4 and M5, and capacitor C1 at node 408. The source of transistor M7 can connect to Vss. The drain of transistor M8 can connect to Vdd. The gate of transistor M8 can connect to transistors M3 and M6, as well as inductor L1 and capacitor C2 at node 406. The source of transistor M8 can connect to the drain of transistor M7 as well as to capacitors C2 and C3 and varactor D1 at node 410. The drain of transistor M9 can connect to Vdd and the source of transistor M10 can connect to Vss. The gate of transistor M9 can connect at node 412 to transistor M6, inductor L1, and capacitor C4. The gate of transistor M10 can connect at node 408 to transistors M4, M5, and M7, as well as capacitor C1. At node 416, the source of transistor M9, the drain of transistor M10, capacitors C4 and C5, and varactor D2, can connect. Differential circuit outputs can be taken at nodes 406/412 and/or 410/416.

As one skilled in the art will recognize, alternative components and/or circuit structures may be used in place of those shown in the example of FIG. 4 without departing from the scope of embodiments of the present invention. For example, programmable capacitor banks or arrays may be used in place of varactors or fixed capacitors, and programmable resistor chains or arrays may be used in place of fixed resistors. Bipolar transistors may be used instead of MOS devices. Single-ended periodic signals may be generated instead of differential periodic signals. Different current mirror structures may also be employed. Other types of oscillating devices can be used in the resonator tank (e.g., a crystal oscillator, an LC tank, an RC oscillator circuit). Transistors may be employed as resistive devices, and Schottky diodes may replace diode-configured transistors. Further, specific NMOS and PMOS devices may be replaced with complementary devices (generally receiving complementary input signals) for different circuit designs in accordance with such alternative embodiments.

An Exemplary Oscillator Control Circuit Operation

Current can flow through transistors M1 and M2 to establish DC biasing for the oscillator core portion. The DC current I1 may be generated using any conventional method to derive a DC current, such as by a ratio of matched-length transistors where the reference transistor is maintained in saturation mode by connecting its drain and gate together and by supplying a reference current (Ids). DC current I1 may provide an established DC bias at the drain of transistor M1 that can be resistively coupled through transistor M3 (e.g., M3 may be a high impedance device) to the gate of transistor M8 (node 406). In an alternative embodiment, the established DC bias at the drain of transistor M1 may instead be resistively coupled through transistor M3 to the gate of transistor M9 (node 412). In either such embodiment, a DC operating point for the exemplary LCVCO core can be established in this fashion.

In the LCVCO core, transistors M8 and M9 can provide transconductance (gm), or the ratio of a change in current to a change in voltage, to effectively cancel or offset any resistive losses from inductor L1 or parasitic effects, such as due to layout wiring and/or process characteristics. Accordingly, transistors M8 and M9 may provide positive feedback to facilitate oscillation along with resonator tank 460 (or components thereof, as may be recognized in the art). As to a layout wiring resistance contribution, this may occur if, for example, a terminal connection from L1 to the other connections on the node (e.g., node 412) is excessive so as to add additional resistance to the signal path. In this case, the transconductance of transistor M9 will help to offset that resistive loss at node 412 via the path including capacitor C4, for example.

Transistors M7 and M10 may establish a DC current bias through transistors M8 and M9, respectively. This DC current may, in turn, determine the transconductance (gm) of associated transistors M8 and M9. In a conventional Colpitts type configuration, the gates of transistors M7 and M10 may be held at a fixed DC bias to provide a constant current reference for associated transistors M8 and M9. However, according to embodiments of the present invention, transistors M4 and M5, as well as resistor R1 are included in order to provide DC bias to the gates of transistors M7 and M10.

In generating this DC bias for the gates of transistors M7 and M10, the DC voltage established at the gate of transistor M1 can be used to establish a current flowing through the branch of transistor M4 and resistor R1. This current can then be mirrored to transistors M7 and M10 (Ids) at an appropriate gain using transistor M5. For example, the gate lengths and layout orientations of transistors M5 and M7 may be the same to minimize the effects of process variations, but the respective widths can be used to set the appropriate current gain factor. According to embodiments, the size of transistor M4 may be relatively large so as to make this current gain substantially linear. Resistor R1 may also make changes in the current gain as a function of voltage on the gate of M4 more linear. Further, resistor R1 may effectively reduce a gain of the 406/402/408 loop and improve loop stability.

Capacitors C2, C3, C4, and C5 can provide feedback from the sources of transistors M8 and M9 to their respective gates (e.g., to nodes 406 and 412, respectively). This feedback can cause the positive transconductance of transistors M8 and M9 to appear negative to inductor L1, thus effectively canceling or offsetting the resistance of inductor L1. For example, as the voltage at node 412 rises, transistor M9 turns on more, allowing more current to flow to node 416. This in turn raises the voltage level at node 416, which via capacitor C4, will raise the voltage at node 412 further and this "negative resistance" can offset a resistive effect through inductor L1.

In the exemplary LC type of resonator tank, the series combination of capacitors C2, C3, C4, and C5, as well as inductor L1 can determine the frequency of oscillation of the LCVCO. Variable capacitors (e.g., varactors) D1 and D2 may be used to effectively change the parallel equivalent values of capacitors C3 and C5, respectively. Such a change in capacitance, as may be controlled by Vc, can determine the frequency range of the associated LCVCO.

According to embodiments of the present invention, transistor M6 can provide an "imbalance" across inductor L1. This imbalance can have the effect that the DC average voltage with respect to ground increases on the gates of transistors M8 and M9 when the gate-to-source voltage of transistor M6 (e.g., voltage across nodes 406 and 412) is large enough to turn the device on and allow current flow through transistor M6. In this situation, current can flow through transistor M3 (e.g., going from node 406 to node 402). As a result, the voltage at the gate of transistor M1 (node 402) can also increase. This increased voltage level at node 402 can cause the current flowing through transistor M4 (e.g., a PMOS device) to decrease. This current decrease through transistor M4 is determined by the established gain due to resistor R1 and transistor M4. As a result, the transconductance of transistors M8 and M9 may decrease due to reduced current flow through the reference branch of resistor R1 and transistors M4 and M5, as mirrored through transistors M7 and M10, as discussed above.

Reduced transconductance of transistors M8 and M9 due to decreased current through the M4 transistor branch can have the effect of reducing the amplitude of oscillation on the gates of transistors M8 and M9 (e.g., nodes 406 and 412, respectively). With less current flowing through transistor M6, the DC voltage at nodes 406 and 412 may be decreased. Because this can cause a reduction in the voltage at node 402, the current through the transistor M4 branch (e.g., resistor R1, transistors M4 and M5) can increase. According to embodiments, in order to further improve stability of this feedback loop, capacitor C1 may be included between node 408 and Vss.

Capacitor C1 can have the effect of averaging the current flowing through transistors M7 and M10 over a period that is substantially established by the associated RC time constant. This time constant is largely composed of the resistance provided by transistor M5 and capacitor C1. When this feedback loop reaches equilibrium, the current flowing through transistors M7 and M10 is essentially optimized to provide an amplitude of oscillation such that transistor M6 may be substantially determining the amplitude. This amplitude may be approximately twice the gate-to-source threshold voltage of transistor M6, although this ratio of the amplitude to threshold voltage may vary according to design considerations. According to certain embodiments, the current needed to sustain this amplitude may be less than or equal to the maximum current needed for oscillation over the process and temperature variations of the LCVCO circuit. Accordingly, for a typical or nominal processing case, the current may be substantially less than the current needed at a "maximum" process/temperature corner.

As a further aspect of embodiments of the present invention, for cases where there is some uncertainty in the design, particularly due to insufficiently characterized parasitics at the frequency of interest, a higher-than-needed transconductance can be set for circuit start-up. As discussed above, the transconductance of oscillator transistors (e.g., transistors M8 and M9) should be high enough to overcome the process parasitics to sustain the positive feedback loop for oscillation. However, during operation beyond the start-up phase, the current may decrease to a value needed to sustain oscillation.

Figure 5:
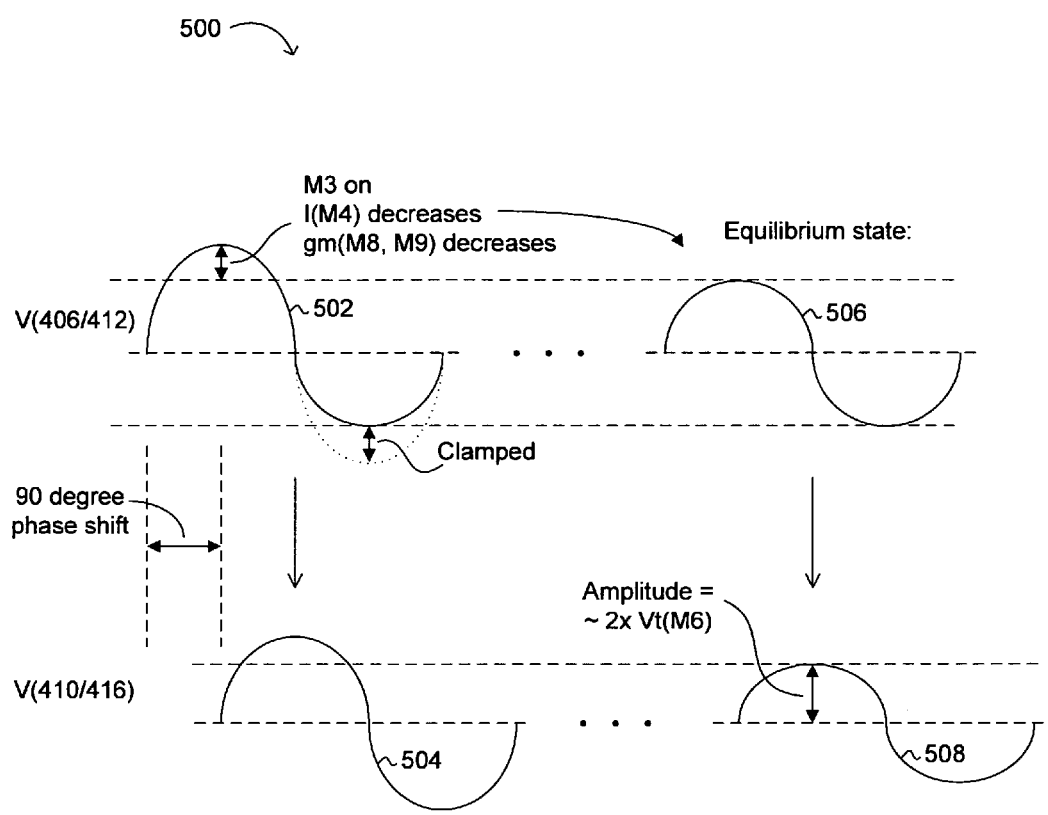
FIG. 5 is a waveform diagram showing exemplary oscillator operation for the circuit of FIG. 4.

Referring now to FIG. 5, a waveform diagram showing exemplary oscillator operation for the circuit of FIG. 4 is indicated by the general reference character 500. Viewing the waveforms of FIG. 5 in conjunction with the circuit of FIG. 4, waveform 502 can correspond to nodes 406/412 (oscillating voltages at nodes 406 and 412 may generally be 180 degrees out-of-phase) in an overshoot situation, while waveform 506 can correspond to nodes 406/412 in an equilibrium state. Similarly, waveform 504 can correspond to nodes 410/416 (oscillating voltages at nodes 410 and 416 may generally be 180 degrees out-of-phase) in an overshoot situation, while waveform 508 can correspond to nodes 410/416 in an equilibrium case. As shown, waveforms 504 and 508 may be phase-shifted by 90 degrees from corresponding waveforms 502 and 506, respectively.

During such an overshoot situation, transistor M3 may allow current to flow into node 402, thus increasing the current through the branch including transistor M4. This increased current causes the transconductance of transistors M8 and M9 to decrease until an equilibrium state is attained (see waveform 506). Further, a clamping effect can be produced by imbalance transistor M6 whereby a level on node 412 that may be too low relative to node 406 may turn on transistor M6. This allows charge into node 412, so by the action of inductor L1, may also increase current via node 406. As discussed above, this increased current may pass through transistor M3 and into bias circuit 420, which may effectively regulate bias signal 402 so as to reduce the amplitude of oscillation.

In this fashion, an amplitude of a periodic signal can be effectively controlled. Thus, embodiments of the present invention can advantageously provide a reliable and simplified design approach for amplitude control and substantial energy reduction or minimization in an oscillator, such as an LCVCO circuit or a Colpitts differential oscillator. Further, embodiments of the present invention are adaptable to any LCVCO or like circuit where a current is used to control the transconductance of one or more gain transistors.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An oscillator, comprising:
   a) a bias circuit configured to provide first and second bias signals;
   b) an oscillator core configured to provide a periodic signal having (i) a frequency responsive to said second bias signal and (ii) an amplitude responsive to said second bias signal, said oscillator core being further configured to provide a feedback signal, said oscillator core further having a drive circuit lacking cross-coupled transistors; and
   c) a current/amplitude controller configured to control said amplitude by dynamically adjusting said first bias signal in response to said feedback signal.

2. The oscillator of claim 1, further comprising a resonator tank having a resonator therein, and wherein said current/amplitude controller includes a transistor coupled across said resonator tank and configured to provide an imbalance across said resonator.

3. The oscillator of claim 2, wherein said oscillator core includes a resonator tank and two non-inverting amplifiers, said resonator tank comprising an inductor and a plurality of capacitors coupled thereto, wherein:
  a first end of said inductor is an input to a first of said two non-inverting amplifiers and an output of said first non-inverting amplifier is couple to said first end of said inductor through one of said plurality of capacitors; and
  a second end of said inductor is an input to a second of said two non-inverting amplifiers and an output of said second non-inverting amplifier is couple to said second end of said inductor through another of said plurality of capacitors.

4. The oscillator of claim 2, wherein said feedback signal comprises an output of said resonator.

5. The oscillator of claim 2, wherein said amplitude is about twice a threshold of said transistor when said oscillator is in an equilibrium state.

6. The oscillator of claim 2, wherein said resonator tank includes a variable capacitor having a capacitance correlated to a range of said frequency.

7. The oscillator of claim 1, wherein said current/amplitude controller includes a capacitor configured to substantially stabilize a bias and/or current input into said oscillator core.

8. The oscillator of claim 7, wherein said current/amplitude controller includes a resistance coupled to a first transistor, said first transistor receiving said bias signal and providing bias and/or current input.

9. An oscillator control circuit, comprising:
  a) a current mirror controlled by a bias signal and providing a mirrored current;
  b) a capacitor coupled to said current mirror, configured to stabilize said mirrored current and provide said stabilized, mirrored current to an oscillator;
  c) an amplitude detection circuit, configured to provide amplitude information from a periodic signal output by said oscillator; and
  d) a feedback circuit configured to adjust said bias signal in response to said amplitude information.

10. The oscillator control circuit of claim 9, wherein said current mirror comprises (i) a first transistor receiving a first substantially fixed voltage and said bias signal, and (ii) a second transistor coupled to a second substantially fixed voltage different from said first substantially fixed voltage, said second transistor being configured to provide said mirrored current.

11. The oscillator control circuit of claim 10, said current mirror further comprising a resistor coupled between said first transistor and a power supply, said resistor being configured to affect or control a gain of said first transistor.

12. The oscillator control circuit of claim 9, wherein said oscillator comprises a resonator, and said amplitude detection circuit comprises a third transistor receiving said amplitude information and being configured to provide an imbalance across said resonator.

13. The oscillator control circuit of claim 9, wherein said feedback circuit comprises a fourth transistor configured to receive said amplitude information and to adjust said bias signal.

14. An oscillator, comprising:
  a resonator tank having a first resonator end node at a first end of said resonator tank and a second resonator end node at a second end of said resonator tank;
  a transistor having a control input node for controlling a current path between a first transistor end node and second transistor end node, said control input node being coupled to said first resonator end node, said first transistor node being coupled to a first fixed voltage and said second transistor end node being coupled to said second resonator end node;
  a first non-inverting amplifier having a first amplifier input coupled to said first resonator end node and a first amplifier output coupled through a first capacitor back to said first resonator end node, said first non-inverting amplifier having a first amplifier gain dependent upon a gain-bias control signal;
  a second non-inverting amplifier having a second amplifier input coupled to said second resonator end node and a second amplifier output coupled through a second capacitor back to said second resonator end node, said second non-inverting amplifier having a second amplifier gain dependent upon said gain-bias control signal;
  an amplitude control circuit for monitoring a measure of a voltage amplitude at said first resonator end and producing said gain-bias control signal.

15. The oscillator of claim 14, wherein said gain-bias control signal is inversely proportion to said measure of a voltage at said first resonator end node.

16. The oscillator of claim 14, wherein said first and second resonator end nodes are defined as two opposite ends of an inductor.

17. The oscillator of claim 14, further having an absence of cross-coupled transistors across said resonator tank.

18. The oscillator of claim 14, wherein:
  said first amplifier include a first control transistor and a first gain controlling load, said first control transistor having a first control input defined as said first amplifier input, a first current path node coupled to a first power rail, and a second current path node defined as said first amplifier output, wherein said first control input modulates a current path between said first and second current path nodes, and wherein said second current path node is coupled through said first gain controlling load to a second power rail;
  said second amplifier include a second control transistor and a second gain controlling load, said second control transistor having a second control input defined as said second amplifier input, a third current path node coupled to said first power rail, and a fourth current path node defined as said second amplifier output, wherein said second control input modulates a current path between said third and fourth current path nodes, and wherein said fourth current path node is coupled through said second gain controlling load to a second power rail.

19. The oscillator of claim 18, wherein said first and second gain controlling loads are each transistors having their respective control input node coupled to said gain-bias control signal.

* * * * *